United States Patent
Buijsse et al.

(10) Patent No.: US 11,456,149 B2
(45) Date of Patent: Sep. 27, 2022

(54) METHODS AND SYSTEMS FOR ACQUIRING 3D DIFFRACTION DATA

(71) Applicant: FEI Company, Hillsboro, OR (US)

(72) Inventors: Bart Buijsse, Eindhoven (NL); Alexander Henstra, Eindhoven (NL); Yuchen Deng, Eindhoven (NL)

(73) Assignee: FEI Company, Hillsboro, OR (US)

(*) Notice: Subject to any disclaimer, the term of this patent is extended or adjusted under 35 U.S.C. 154(b) by 2 days.

(21) Appl. No.: 16/835,218

(22) Filed: Mar. 30, 2020

(65) Prior Publication Data
US 2021/0305010 A1    Sep. 30, 2021

(51) Int. Cl.
*H01J 37/22* (2006.01)
*H01J 37/26* (2006.01)
*H01J 37/32* (2006.01)

(52) U.S. Cl.
CPC .......... *H01J 37/222* (2013.01); *H01J 37/261* (2013.01); *H01J 37/32715* (2013.01); *H01J 2237/22* (2013.01); *H01J 2237/2617* (2013.01)

(58) Field of Classification Search
CPC .. H01J 37/222; H01J 37/261; H01J 37/32715; H01J 2237/22; H01J 2237/2617; H01J 2237/2802; H01J 2237/2803; G01N 23/20058; G01N 2223/102
See application file for complete search history.

(56) References Cited

U.S. PATENT DOCUMENTS

| | | | |
|---|---|---|---|
| 6,882,477 B1* | 4/2005 | Schattenburg | G03F 7/70383 359/35 |
| 2003/0160969 A1* | 8/2003 | Endo | G01B 11/2441 356/520 |
| 2008/0149833 A1* | 6/2008 | Endoh | H01J 37/141 250/311 |
| 2011/0284744 A1* | 11/2011 | Zewail | H01J 37/28 250/307 |
| 2015/0348749 A1 | 12/2015 | Lang et al. | |
| 2017/0236684 A1* | 8/2017 | Kohno | H01J 37/22 250/311 |
| 2017/0309441 A1* | 10/2017 | Flanagan, IV | H01J 37/261 |
| 2018/0254167 A1 | 9/2018 | Zhao et al. | |
| 2020/0025796 A1* | 1/2020 | Matejka | G01Q 40/02 |

(Continued)

FOREIGN PATENT DOCUMENTS

EP   1852890 A1   11/2007
WO   WO-2009007668 A1   1/2009

OTHER PUBLICATIONS

Mauro Gemmi, Enrico Mugnaioli, Tatiana E. Gorelik, Ute Kolb, Lukas Palatinus, Philippe Boullay, Sven Hovmöller, and Jan Pieter Abrahams, 3D Electron Diffraction: The Nanocrystallography Revolution, ACS Central Science, 2019 5 (8), 1315-1329.

(Continued)

*Primary Examiner* — David A Vanore (57) ABSTRACT

Diffraction patterns of a sample at various tilt angles are acquired by irradiating a region of interest using a first charged particle beam. Sample images are acquired by irradiating the region of interest using a second charged particle beam. The first and second charged particle beams are formed by splitting charged particles generated by a charged particle source.

19 Claims, 7 Drawing Sheets

(56) References Cited

U.S. PATENT DOCUMENTS

2021/0305007 A1* 9/2021 Henstra .................. H01J 37/26
2021/0305012 A1* 9/2021 Henstra ................ H01J 37/153

OTHER PUBLICATIONS

EP21164764.9, Extended European Search Report, dated Aug. 20, 2021, 6 pages.
Nathaniel J.E et al., "Toward High-Throughput Defect Density Quantification: A Comparison of Techniques for Irradiated Samples", Ultramicroscopy, Elsevier, Jul. 30, 2019 (Jul. 30, 2019), vol. 206, 112820, XP085904815, pp. 1-9, DOI:10.1016/J.ULTRAMIC.2019. 112820 [retrieved on Jul. 30, 2019].

* cited by examiner

FIG. 7

METHODS AND SYSTEMS FOR ACQUIRING 3D DIFFRACTION DATA

CROSS REFERENCE TO RELATED APPLICATIONS

This application relates to patent application Ser. No. 16/834,963, filed on Mar. 30, 2020, titled "Dual Beam Bifocal Charged Particle Microscope", by Henstra et al., which is incorporated herein by reference in its entirety and for all purposes.

FIELD OF THE INVENTION

The present description relates generally to methods and systems for acquiring 3D diffraction data, and more particularly, to tracking and correcting crystal position while acquiring the diffraction tilt series.

BACKGROUND OF THE INVENTION

The structure of molecule that forms a crystal may be resolved based on 3D diffraction data, that is, diffraction patterns of the crystal acquired at multiple tilt angles. The diffraction patterns may be acquired by irradiating the crystal with a charged particle beam, such as an electron beam, while tilting the sample around an arbitrary, non-crystallographic axis of the crystal. To obtain high quality diffraction pattern, the size of the incident beam should be comparable to the size of the crystal. However, the crystal under investigation may shift relative to the incident beam during data acquisition caused by movement due to eccentricity of the sample stage and/or sample drift.

One way to correct crystal shift is to track the shift by comparing sample images taken before and after tilting the sample, and correcting the shift by adjusting the incident beam and/or the sample position. However, this method may be time consuming because the imaging system has to be switched frequently between the diffraction mode and the imaging mode. The long total acquisition time may increase sample radiation damage and introduce more crystal shift.

SUMMARY

In one embodiment, a method for acquiring 3D diffraction data comprises splitting charged particles generated from a charged particle source into a first charged particle beam and a second charged particle beam, wherein the first charged particle beam and the second charged particle beam have different focal planes near a sample plane; acquiring a diffraction pattern by irradiating a region of interest (ROI) of the sample with the first charged particle beam; and acquiring a sample image by irradiating the ROI with a second charged particle beam. The charged particle beam generated from the charged particle source is split by a bifocal beamformer. The bifocal beamformer may individually apply a quadrupole field on one or both of the first and second charged particle beams. Further, the bifocal beamformer may individually deflect one or both of the first and second charged particle beams. As such, the first and second charged particle beams irradiate the same ROI of the sample at different incident angles. The diffraction pattern and the sample image may be acquired simultaneously using one detector. The position change of the crystal may be tracked and corrected based on the sample image. In this way, the total data acquisition time for the 3D diffraction data may be reduced. Further, timely tracking and correcting the crystal position allow high quality diffraction patterns to be acquired with a narrow incident beam.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for acquiring multiple diffraction patterns of a sample. The multiple diffraction data maybe a diffraction tilt series, such an electron diffraction tilt series acquired using a bifocal multibeam charged particle system. Such bifocal multibeam charged particle system is disclosed patent application Ser. No. 16/834,963, filed on Mar. 30, 2020, by Henstra et al., titled "Dual Beam Bifocal Charged Particle Microscope," which is referenced herein in its entirety and for all purposes. In the bifocal multibeam charged particle system, the charged particles generated from a charged particle source positioned within an optical column are split into an axial beam travelling along the primary axis of the optical column and an off-axial beam travelling away from the primary axis of the optical column. The two charged particle beams have different focal properties. For example, the two charged particle beams have different focal planes at or near the sample plane. Further, the first and second charged particle beams irradiate a region of interest (ROI) of the sample with different incident angles. That is, the two charged particle beams are titled with respect to each other at the sample plane.

The charged particles generated from the charged particle source may be split by a bifocal beamformer. The bifocal beamformer may individually modify the beam properties of one or both of the two charged particle beams. That is, the beam property of one of the charged particle beams may be modified independently from the other charged particle beam. The beam properties may include focal property and beam direction. The bifocal beamformer may adjust the focal property of at least one of the charged particle beams by applying a quadrupole field. The bifocal beamformer may further deflect at least one of the charged particle beams relative to the primary axis by applying a dipole field. In one example, the bifocal beamformer applies a quadrupole field to one of the charged particle beams, and a multipole element positioned downstream of the bifocal beamformer modifies the charged particle beam into a cylindrical symmetric beam. The combined effect of the bifocal beamformer and the multiple element causes the two charged particle beams to have different focal planes near the sample plane.

Figure 6:
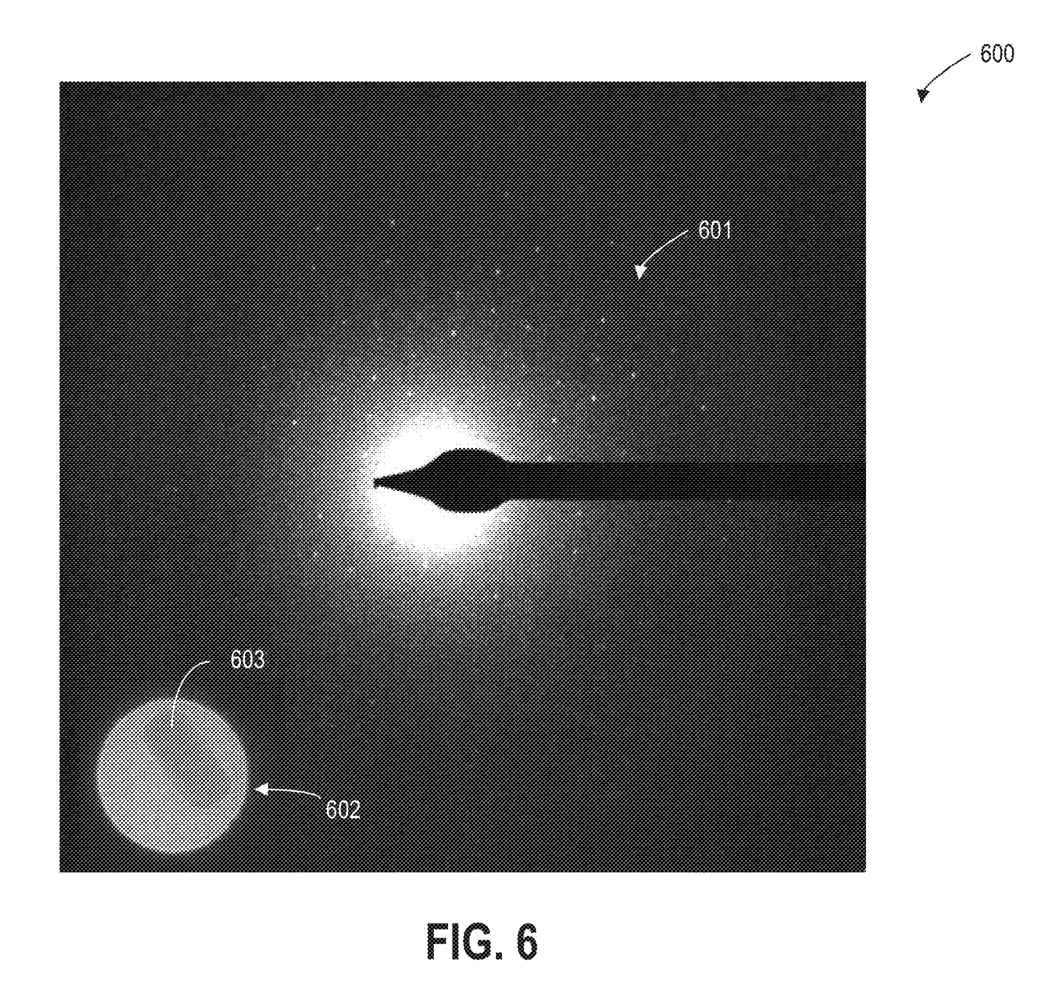
FIG. 6 is an example image acquired by the bifocal multibeam charged particle system.

The axial and off-axial beams irradiate the ROI of the sample with different incident angles and different beam divergences. A diffraction pattern and a sample image may be formed on a detector positioned downstream of the sample plane. The diffraction pattern may be formed by one of the two charged particle beams, and the sample image is formed by the other charged particle beam. The diffraction pattern may be formed by either the axial beam or the off-axial beam. The field of view of the sample image may be larger than the field of view of the diffraction pattern. The sample image may show the contour of the crystal within the ROI. In one example, the diffraction pattern is a selected area electron diffraction (SAED) pattern. In another example, the sample image is a defocused sample image. In this way, the diffraction pattern and the sample image of the crystal within the ROI may be acquired simultaneously as a bifocal image using the detector. FIG. 6 is an example bifocal image acquired by the bifocal multibeam charged particle system. The image includes the diffraction pattern and the sample image of a crystal.

Figure 1:
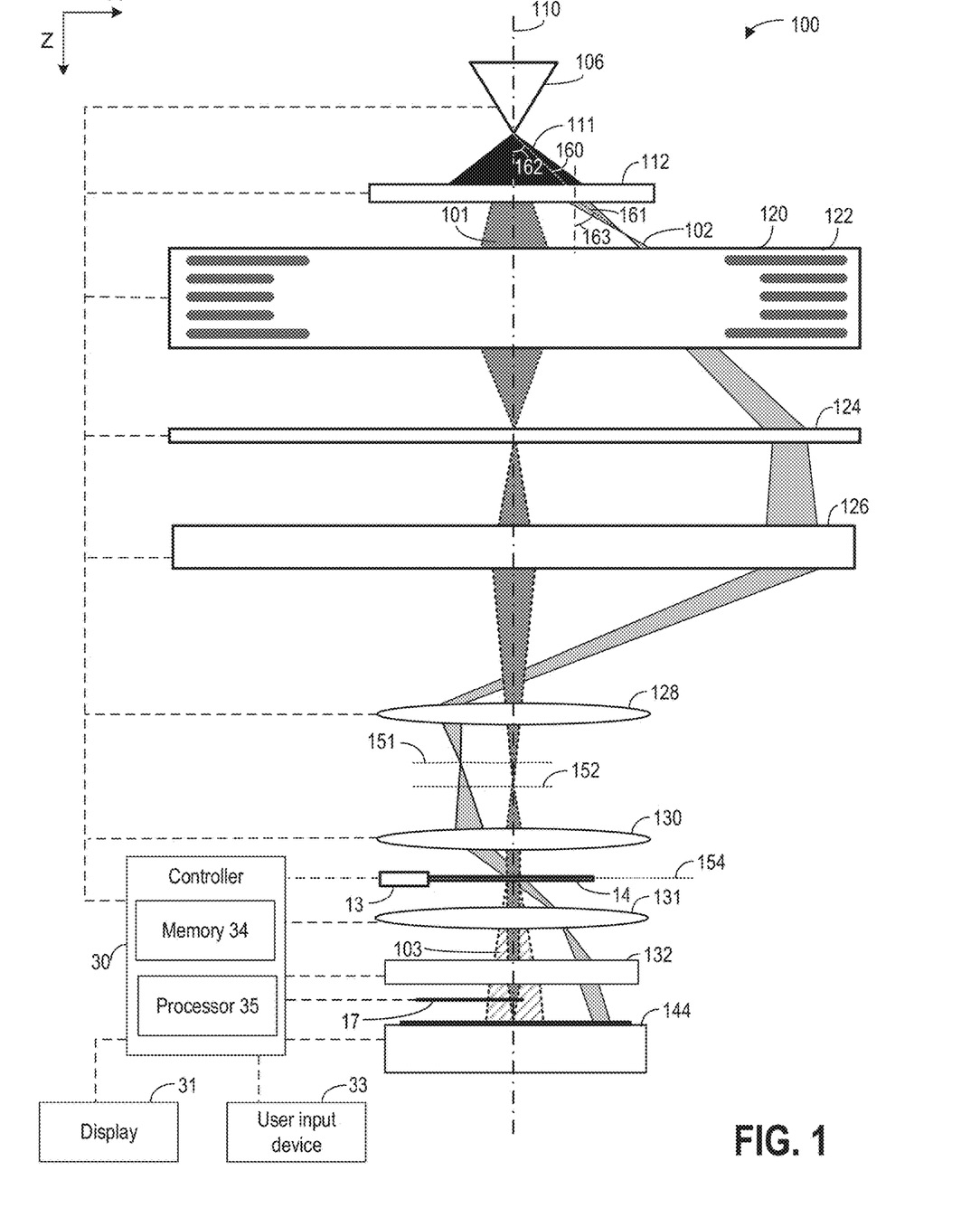
FIG. 1 illustrates a bifocal multibeam charged particle system for 3D diffraction data acquisition in a x-z plane.
Figure 2:
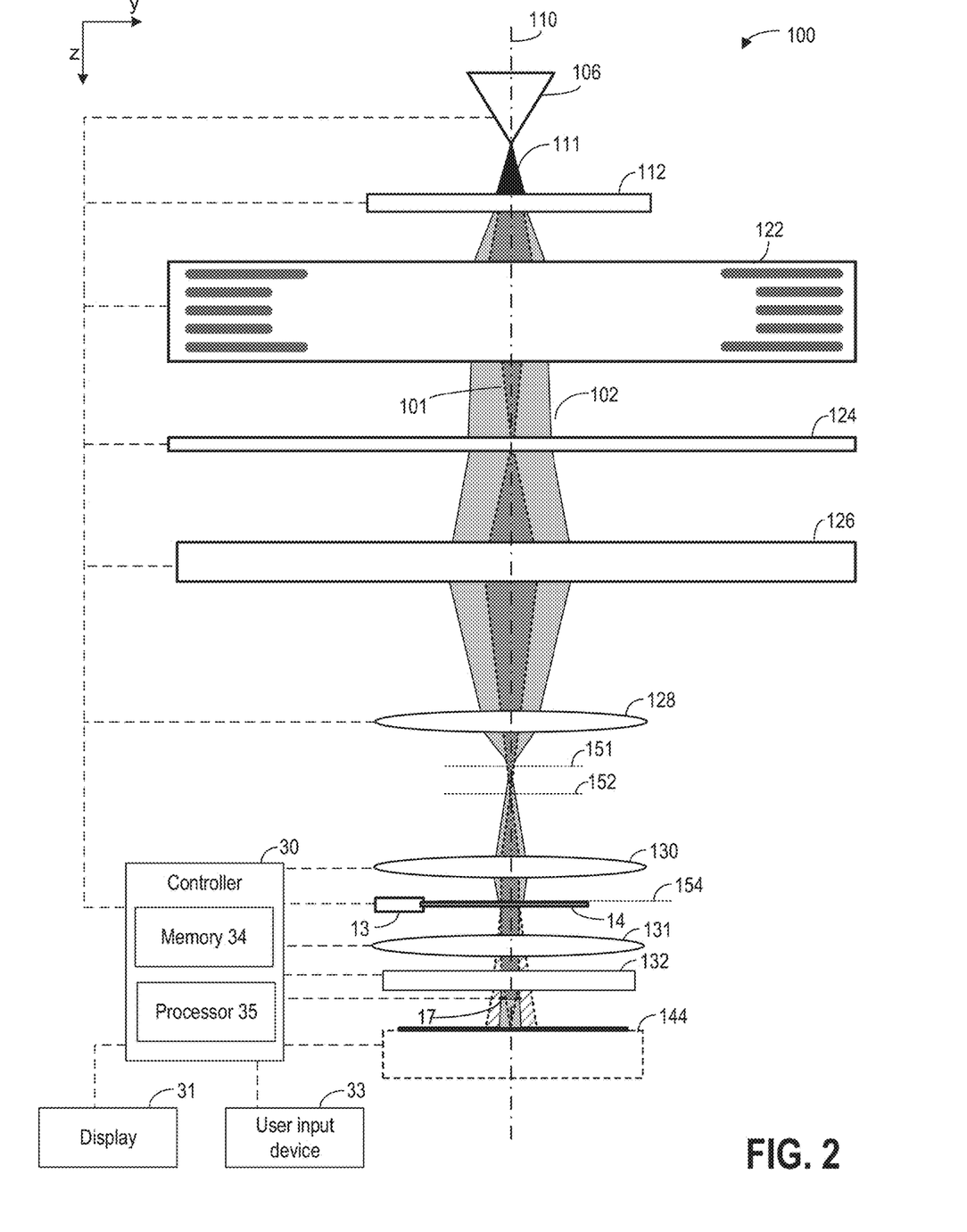
FIG. 2 illustrates the bifocal multibeam charged particle system of FIG. 1 in a y-z plane.
Figure 3A:
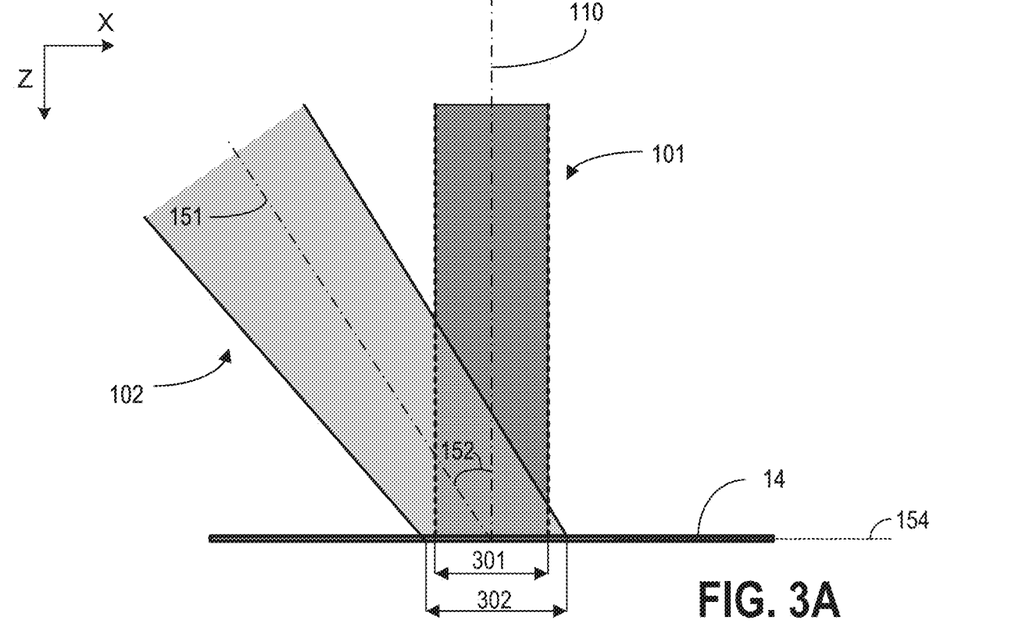
FIG. 3A illustrates incident angles of a first and a second charged particle beams of the bifocal multibeam charged particle system of FIG. 1 in the x-z plane.
Figure 3B:
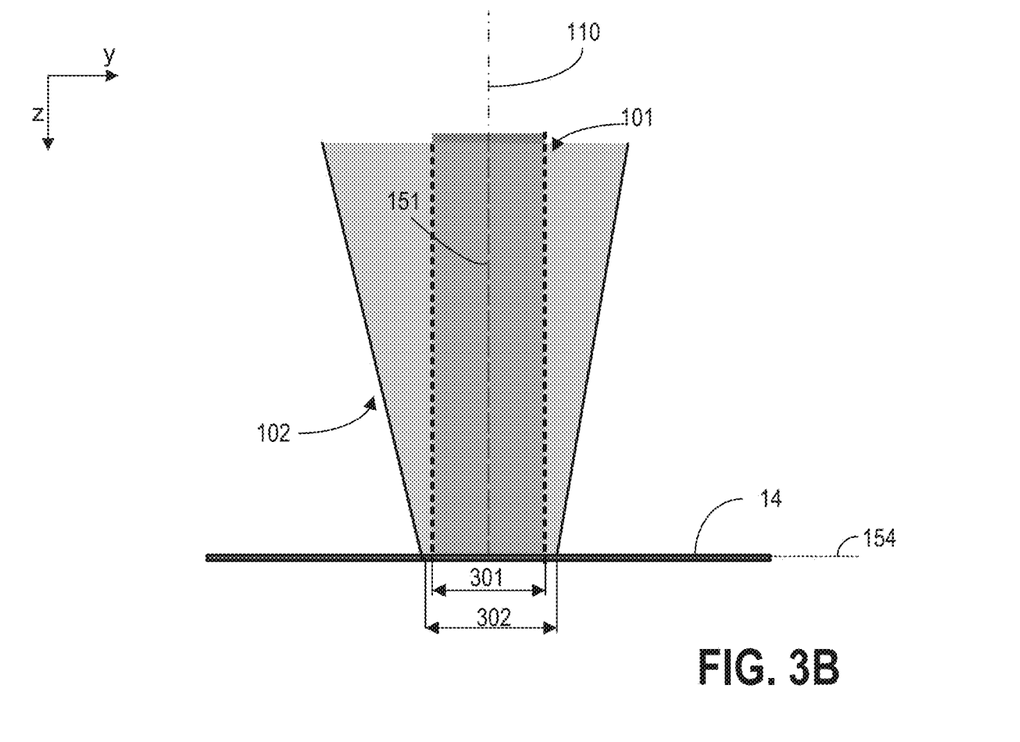
FIG. 3B illustrates incident angles of the first and the second charged particle beams of the bifocal multibeam charged particle system of FIG. 1 in the y-z plane.
Figure 4:
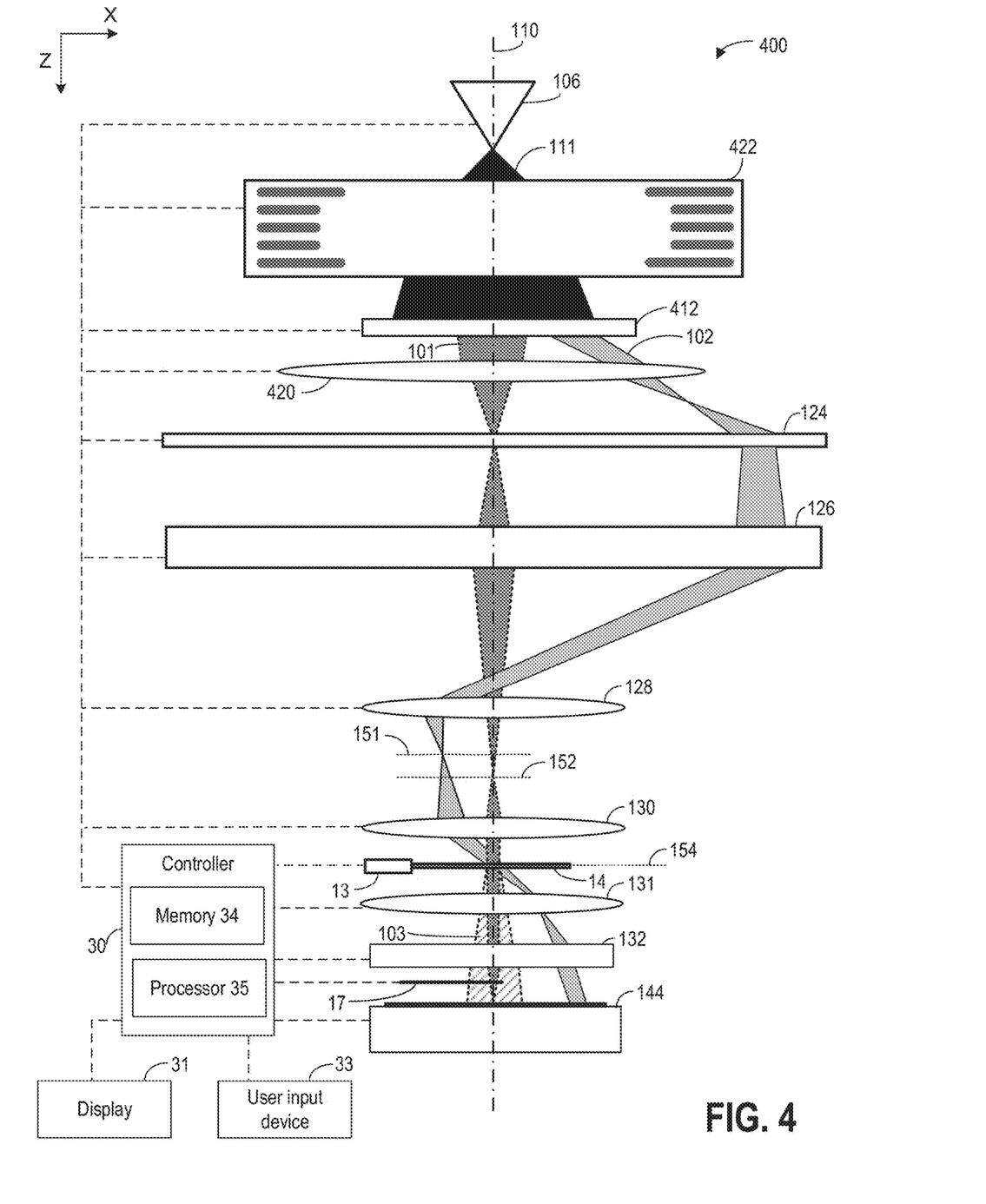
FIG. 4 illustrates a bifocal multibeam charged particle system for 3D diffraction data acquisition in the x-z plane.

FIG. 1 and FIG. 2 show an example bifocal multibeam charged particle system in the x-z and y-z plane, respectively. The bifocal beamformer is positioned upstream of the accelerator. The diffraction pattern is formed with an axial parallel beam, and the sample image is formed with an off-axial converging beam. The axial beam and the off-axial beam have different incident angles at the sample plane, as shown in FIGS. 3A-3B. FIG. 4 shows another example bifocal multibeam charged particle system, wherein the bifocal beamformer is positioned downstream of the accelerator. In some examples, the diffraction pattern may be acquired with the off-axial beam, and the sample image may be acquired with the axial beam. In some examples, both the axial beam and the off-axial beam may be non-parallel (converging or diverging).

As one example, the bifocal multibeam charged particle system may be used for screening multiple particles on a transmission electron microscopy (TEM) grid by assessing the diffraction pattern of each particle. By taking the sample image and the diffraction pattern simultaneously, frequent mode switching between the imaging mode and the diffraction mode is avoided, thus the screening time can be reduced. The sample image can be used to improve the centering of the beam with respect to each particle. E.g. particles may be separated by a distance that requires a large stage movement, and the accuracy of the atlas that is used for navigation may be insufficient to directly bring the next particle exactly within the illuminated area after a stage movement.

Figure 5:
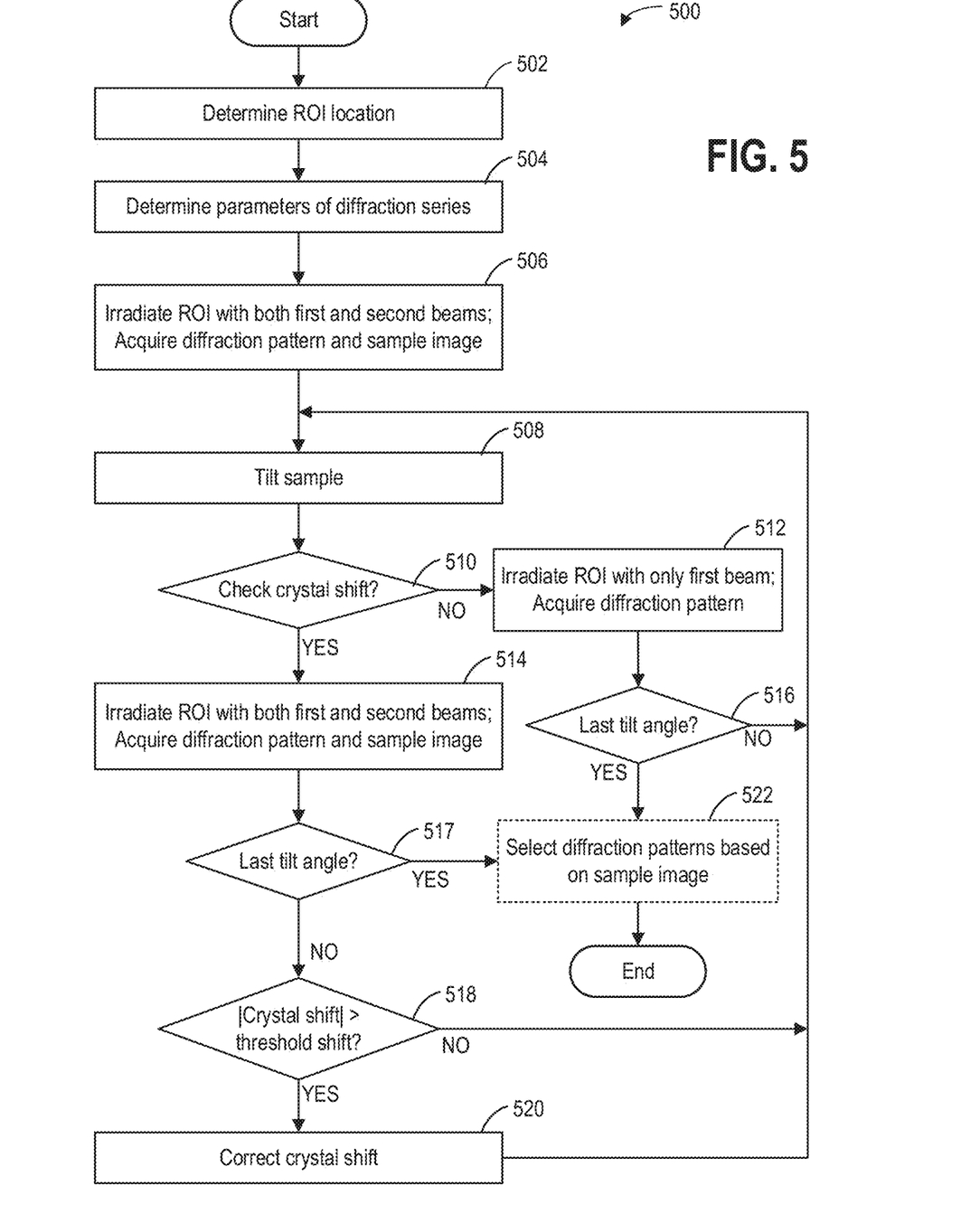
FIG. 5 is a flowchart for acquiring the 3D diffraction data.
Figure 7:
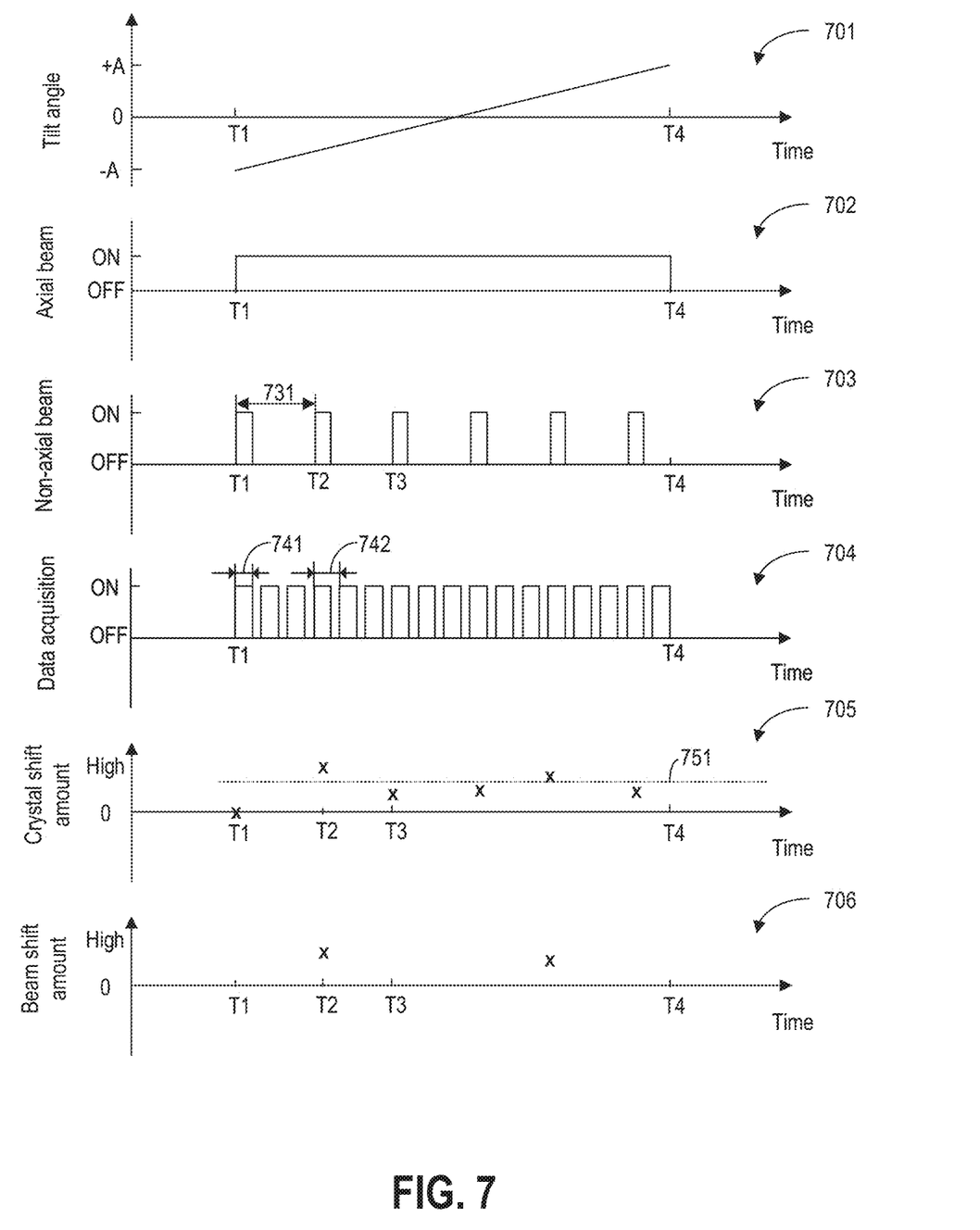
FIG. 7 shows an example timeline for acquiring the 3D diffraction data with the bifocal multibeam charged particle system.

As another example, the bifocal multibeam charged particle system may be used for tracking and compensating for sample shift. FIG. 5 shows an example method for acquiring the 3D diffraction data using the bifocal multibeam charged particle systems. The bifocal image acquired using the bifocal multibeam charged particle system may include a sample image and/or a diffraction pattern, depending on which one of the two charged particle beams irradiates the ROI. The bifocal image includes a diffraction pattern when the ROI is irradiated with a first charged particle beam. The bifocal image includes a sample image when the ROI is irradiated with a second charged particle beam. Further, the bifocal image includes both the diffraction pattern and the sample image when the ROI is irradiated with both the first and the second charged particle beams. While tilting the sample around a tilt axis, multiple diffraction patterns are acquired. Each diffraction pattern corresponds to a different tilt angle when the sample is tilted stepwise, or a different tilt angle range when the sample is tilted continuously. The sample images may be acquired simultaneously with some or all of the diffraction patterns for tracking and compensating for crystal shift in real time, during the 3D diffraction data acquisition. The crystal shift may be estimated by comparing sample images acquired at different tilt angles or tilt ranges. For example, crystal location is estimated based on the 2D contour of the crystal in the sample image. The crystal shift can then be calculated based on the change of crystal location between the sample image and a reference sample image, as well as the tilt angles of the sample image and the reference image. The crystal shift may be corrected by adjusting relative position between the sample and the first and second charged particle beams. After correcting the crystal shift, the crystal location is moved back to the crystal location in the reference sample image. By tracking and compensating crystal shift based on the sample image formed by the second charged particle beam, imaging mode switching during 3D diffraction data acquisition is avoided. Therefore, data acquisition time is reduced. Timely tracking and compensating crystal shift allow reduced irradiation area on the sample surface, so that the irradiation area may be small and comparable to the crystal size. Small irradiation area reduces background noise generated from the crystal environment, and increases quality of the diffraction pattern. Further, sample damage due to charged particle irradiation may be reduced by blanking or blocking the second charged particle beam, and/or reducing the intensity of the second charged particle beam comparing to the first charged particle beam. Moreover, based on the sample image, the acquired diffraction patterns may be selected based on the sample image to form a diffraction tilt series for crystallography. FIG. 7 shows an example timeline for acquiring the 3D diffraction data.

Turning to FIG. 1, a bifocal multibeam charged particle system 100 is shown in the x-z plane. The bifocal multibeam charged particle system 100 includes an optical column (not shown) for forming two charged particle beams with different focal properties. The optical column comprises charged particle source 106, and optical components such as bifocal beamformer 112, focusing component 120, focusing column 126, a multipole element 124, and mini-condenser 128. In some examples, one or more lenses are positioned between charged particle source 106 and the bifocal beamformer, which enables tuning of the current in both beams. These lenses are preferably electrostatic lenses.

The charged particle beam 111 generated by the charged particle source 106 is split into the first charged particle beam 101 and the second charged particle beam 102 by the bifocal beamformer positioned downstream of the charged particle source 106. The charged particle source 106 may be an electron source. The first charged particle beam 101 is an axial beam that travels along the primary axis 110 of the optical column. The primary axis 110 may be the emission axis of the charged particle source 106. The primary axis 110 is parallel to the z axis. The second charged particle beam 102 is an off-axial beam that travels along an axis 161 different from the primary axis 110. The bifocal beamformer 112 modifies the focal property of at least one of the first and second charged particle beams, so that the first and second charged particle beams have different focal properties. The bifocal beamformer 112 also deflects the second charged particle beam away from the primary axis. That is, the angle 163 between primary axis 110 and beam axis 161 of the second charged particle beam exiting the bifocal beamformer 112 is greater than the angle 162 between the primary axis 110 and the beam axis 160 of the portion of charged particle beam 111 that forms the second charged particle beam.

In some examples, the bifocal beamformer may be a microelectromechanical system (MEMS) or an aperture lens array. In order to change the focal properties of at least one of the charged particle beams, the bifocal beamformer may apply at least a quadrupole lensing effect to the at least one of the charged particle beams that focuses, stigmates, and/or otherwise modifies at least one of the beams such that the corresponding focal properties of the beams are made different. The quadrupole lensing effect may focus the second charged particle beam in the x-z plane and expand the second charged particle beam in the y-z plane (shown in FIG. 2). The bifocal beamformer may further be configured to generate at least a dipole electromagnetic field that causes at least one of the beams to be deflected. For example, the bifocal beamformer may generate a dipole field that applies a deflection force to the second charged particle beam in a direction perpendicular to the primary axis. The degree of deflection of the second charged particle beam from the primary axis may be adjusted by adjusting the dipole strength of the bifocal beamformer.

After exiting the bifocal beamformer 112, both the first and second charged particle beams sequentially pass through focusing component 120, multipole element 124, focusing column 126, mini-condenser 128, and pre-sample objective lens 130, before irradiating sample 14. The sample 14 locates at the sample plane 154 when the sample is not tilted. Sample plane 154 is a plane orthogonal to the primary axis 110. The focusing component 120 positioned downstream of the bifocal beamformer accelerates/decelerates, focuses, and/or directs the first charged particle beam 101 and the second charged particle beam 102 towards focusing column 126 positioned downstream of the focusing component 120. The focusing component 120 may be an accelerator 122 that focuses and accelerates the charged particle beams.

The multipole element 124 is positioned at a focal plane of the first charged particle beam between the focusing component 120 and the focusing column 126 to adjust the beam shape of the second charged particle beam. The multipole element 124 does not affect the first charged particle beam. The multipole element 124 may be a stigmator for applying a quadrupole lensing effect complementary to the quadrupole lensing effect of the bifocal beamformer, in order to make the second charged particle beam profile to be cylindrically symmetric. The combined action of the bifocal beamformer 112 and the multipole element 124 causes the first and the second charged particle beams having different focal planes near the sample plane 154. The first and second charged particle beams have different beam divergency at the sample plane. In one example, the first charged particle beam is parallel at the sample plane, and the second charged particle beam is non-parallel at the sample plane. In some examples, no multipole element is positioned downstream of the beamformer. The beam profile of the charged particle beam for forming the sample image may not be circular at the sample plane.

The focusing column 126 and the mini-condenser 128 bring the deflected second charged particle beam close to the primary axis 110. The mini-condenser may be switched off optically in some examples to create certain illumination conditions. The first charged particle beam and the second charged particle beam focus at different planes (152 and 151) upstream from the pre-sample objective lens 130. The first charged particle beam and the second charged particle beam both irradiate a ROI of the sample after passing through pre-sample objective lens 130 positioned downstream of the mini-condenser 128. The beam axes of the first and second charged particle beams may intercept at the sample plane 154. The second charged particle beam is a nonparallel (converging or diverging) beam at the sample plane. In one example, the first charged particle beam is a parallel beam at the sample plane. In another example, the first charged particle beam is non-parallel at the sample plane. The second charged particle beam impinges onto the sample 14 with a non-zero tilt angle relative to the first charged particle beam.

The sample 14 is held by sample holder 13 positioned within a sample chamber (not shown) coupled to the optical column. The sample holder 13 may adjust sample position by tilting the sample relative to a rotation axis within the sample plane, and/or translating the sample within the sample plane, and/or moving the sample plane along the primary axis.

Detector 144 is positioned downstream from the projection optics 132, wherein the diffraction pattern is focused onto the detector through the post-sample objective lens 131 and the projection optics 132. The pre-sample objective lens 130 and the post-sample objective lens 131 may be combined into a magnetic immersion lens. The unscattered beam may be blocked by beam stopper 17 positioned between the projection optics 132 and detector 144. Scattered charged particles 103 pass through projection lenses 132 and form the diffraction pattern at a first region of the detector 144. The collected scattered charged particles (such as scattered electrons) form a diffraction pattern, such as a selected area electron diffraction (SAED) pattern. The second charged particle beam forms the sample image at a second region of the detector 144. The first region and the second region are offset from each other. That is, the central locations of the first region and the second region are different. The sample image may be rotated relative to the primary axis to maximize the detection area of the detector. The sample image within the bifocal image may be adjusted radially with respect to the diffraction pattern by changing the bifocal optics and the condenser optics. The overall magnification of bifocal image, which may include both the sample image and the diffraction pattern, can be adjusted by the projection system. The sample image may show the 2D contour or outline of the crystal. The sample image may be a low resolution defocused sample image. The image contrast may be high due to the defocus, which may facilitate contour extraction. The crystal position may be tracked based on the sample image. The field of view (FOV) of the sample image is equal or greater than the FOV of the diffraction pattern. The ROI is within the region irradiated by both the first and the second charged particle beams at the sample plane. The ROI contains at least one crystal. Detector 144 outputs data to controller 30 to form the bifocal image.

The bifocal multibeam charged particle system 100 may deflect or block the second charged particle beam to reduce radiation damage to the sample. For example, a blanker is positioned in the beam path of the second charged particle beam. In another example, the bifocal beamformer may block the second charged particle beam while allowing the first charged particle beam to pass. Sample radiation damage may further be reduced by reducing the beam current of the second charged particle beam. The beam current of the second charged particle beam may be reduced by reducing the aperture of the bifocal beam former for the second charged particle beam.

The controller 30 may control the operation of the bifocal multibeam charged particle system 100, either manually in response to operator instructions or automatically in accordance with computer readable instructions stored in non-transitory memory (or computer readable medium) 34. The controller 30 may include a processor 35 and be configured to execute the computer readable instructions and control various components of system 100 in order to implement any of the methods described herein. The controller 30 may adjust the energy of the charged particle beam irradiated towards the sample by adjusting the high voltage level of the charged particle source 106. The controller 30 may adjust the sample position and/or orientation by adjusting the sample holder 13. The controller 30 receives data acquired detector 144 and form images based on the acquired data. The controller 30 may further be coupled to a display 31 to display notifications and/or images of the sample. The controller 30 may receive user inputs from user input device 33. The user input device 33 may include keyboard, mouse, and/or touchscreen. The controller may be configured to solve the molecular structure of the crystal based on the acquired diffraction tilt series.

The controller 30 may adjust the beam properties of the first charged particle beam and the second charged particle beam at the sample plane by adjusting one or more of the bifocal beamformer 112, focusing component 120, focusing column 126, and mini-condenser 128. For example, adjusting the tilt angle between the two charged particle beams at the sample plane may include adjusting the degree of deflection of at least one of the charged particle beams at the bifocal beamformer, wherein the degree of deflection may be adjusted by adjusting the dipole strength of the bifocal beamformer. Adjusting relative position of the two charged particle beams at the sample plane may include adjusting the quadrupole lens strength of the bifocal beamformer. Adjusting the ratio of FOV between the diffraction pattern and the sample image may include adjusting the quadrupole lens strength of the bifocal beamformer. Any change in the optical properties of the charged particle beams at the sample plane (such as the illuminated area, ratio of diameter of the two beams, and mutual tilt angle between the two beams) requires a change in the excitation of one or more condenser lenses. The system should include sufficient number of condenser lenses to provide the flexibility.

The controller 30 may adjust the bifocal beam former 112 and one or more lenses in the optical column for switching between the bifocal multibeam imaging mode and the normal transmission electron microscopy (TEM), and/or scanning electron microscopy (SEM) imaging mode, and/or scanning transmission electron microscopy (STEM). In the normal TEM, SEM and STEM mode, only one charged particle beam is formed by the optical column.

Though the acquisition of electron diffraction pattern and electron microscopy sample image are described by way of example, it should be understood that the diffraction pattern and/or the sample image may be acquired with other microscopy systems. The present discussion is provided merely as an example of one suitable imaging modality. As one example, the sample image of the bifocal image may be a STEM image acquired by scanning one of the electron beams over the sample surface. The diffraction pattern of the bifocal image may be a nanobeam electron diffraction pattern. The FOV of the STEM image is larger than the FOV of the nanobeam electron diffraction pattern.

FIG. 2 shows the bifocal multibeam charged particle system 100 of FIG. 1 in the y-z plane, orthogonal to the x-z plane shown in FIG. 1. The beam axes of the first and second charged particle beams overlap in the y-z plan from the bifocal beamformer 112 to the detector 144.

FIG. 3A shows directions of the charged particle beams relative to the sample 14 in the x-z plane. The first charged particle beam 101 is parallel when it irradiates the sample long the primary axis 110. The second charged particle 102 is converging when it irradiates the sample along axis 151. The angle 152 between the first charged particle beam and the second charged particle beam is nonzero in the x-z plane. In one example, angle 152 is less than 15 mrad. In another example, angle 152 is 10 mrad. The first and the second charged particle beams may both have a circular beam shape on the sample plane. The beam width 302 of the second charged particle beam 102 is equal or greater than the beam width 301 of the first charged particle beam 101 at sample surface. In one example, the beam diameter of the first charged particle beam at the sample surface is 2 um, and the beam diameter of the second charged particle beam at the sample surface is 2.45 um. In another example, the ratio of the beam diameter of the second charged particle beam over the beam diameter of the first charged particle beam is 1-2.

FIG. 3B shows directions of the charged particle beams relative to the sample 14 in the y-z plane. The beam axis 151 of the second charged particle beam 102 overlaps with the primary axis 110 (i.e. beam axis of the first charged particle beam) when viewing from the x-axis direction. The first charged particle beam 101 is parallel when it irradiates the sample long the primary axis 110. The second charged particle 102 is converging when it irradiates the sample along axis 151. The beam width 302 of the second charged particle beam 102 is equal or greater than the beam width 301 of the first charged particle beam 101 at sample plane 154.

In some examples, the beam shapes of the two charged particle beams are different at the sample surface. The beam shape of the first charged particle beam may be circular, and the beam shape of the second charged particle beam may be non-circular.

FIG. 4 shows a bifocal multibeam charged particle system 400, according to some embodiments. Different from the bifocal multibeam charged particle system 100, wherein the bifocal beamformer is positioned upstream of the accelerator, the bifocal beamformer 412 is positioned downstream of accelerator 422 in system 400. Additionally, focusing lens 420 is positioned downstream of the bifocal beam former 412 as a focusing component to focus the first and the second charged particle beams. Similar to system 100, the bifocal beamformer 412 splits the charged particle beam 111 generated by the charged particle source 106 into the first and the second charged particle beams. The bifocal beamformer 412 also deflects the second charged particle beam away from the primary axis 110 in the x-z plane. The arrangements of the rest of the optical components in the optical column, such as the multipole element 124, the focusing column 126, the mini-condenser 128, and the objective lens 130 are similar to the arrangements to the bifocal multibeam system 100 of FIGS. 1-2. The lens excitation of optical components may be different in the system 100 and system 400.

The bifocal multibeam charged particle systems of FIGS. 1-2 and FIG. 4 form a diffraction pattern with the axial beam and a sample image with the off-axial beam. In some embodiments, the diffraction pattern is formed with the off-axial beam, and the sample image is formed with the axial beam. For example, a macroscopic deflector may be positioned downstream of the bifocal beamformer to steer the initially off-axial beam onto the primary axis, and the initially axial beam away from the primary axis.

FIG. 5 shows a method 500 for acquiring 3D diffraction data using the bifocal multibeam charged particle system, such as systems of FIGS. 1-2 and FIG. 4. The diffraction patterns are acquired with the first charged particle beam, and the sample images are acquired with the second charged particle beam. The first charged particle beam may be either the axial beam or the off-axial beam. Crystal shift is tracked and corrected during diffraction pattern acquisition based on the sample images. The acquired diffraction patterns may be selected based on 3D contour of the crystal generated based on the sample images.

At 502, location of the ROI of the sample for 3D diffraction data acquisition is determined. The ROI location may be determined based on sample image, such as TEM image of the sample. For example, based on the sample image, the sample is moved to a location wherein a crystal is located at the center of the ROI. The sample may be a thin lamella prepared using a dual-beam (ion beam and electron beam) system.

At 504, parameters of the diffraction series are determined. The parameters may include beam property such as beam energy, beam current, and field of view of each of the first and second charged particle beams at the sample plane. The parameters may include sample tilting parameters including one or more of tilting range, tilting step, tilting speed, and number of diffraction patterns. The tilting range may be the full tilt range of the sample holder if the 3D diffraction data is acquired for crystallography. Discrete tilt steps may be determined if the 3D diffraction data is acquired for zone axis alignment. The parameters may also include frequency for taking the sample image. The frequency for taking the sample image may be determined based on the sample property. For example, the frequency for sample imaging is reduced if the sample is more prone to radiation damage.

At 506, responsive to the ROI being irradiated with both the first and the second charged particle beams, a diffraction pattern and a sample image are simultaneously acquired in the bifocal image using a detector (such as detector 144 of FIG. 1).

In some examples, only the sample image is acquired at step 506 by irradiating the sample with only the second charged particle beam. The sample image may serve as the initial sample location for correcting crystal shift.

At 508, the sample is tilted to the next tilt angle. In one example, the sample is tilted for a tilt step determined at 504, and the diffraction pattern is acquired while the sample is maintained at a particular tilt angle. Each diffraction pattern corresponds to one tilt angle. In another example, the sample is tilted continuously, and the diffraction pattern is acquired while the sample is tilting. Each diffraction pattern corresponds to a range of the tilt angle. The sample is tilted relative to a tilt axis that is orthogonal to the primary axis and passes the crystal within the sample plane. The tilt axis may be an arbitrary, non-crystallographic axis of the crystal.

At 510, method 500 determines whether crystal shift needs to be checked. Crystal shift may be checked regularly at a frequency determined at 504. For example, the crystal shift may be checked after collecting every other diffraction pattern. If it is determined not to check the crystal shift, at 512, the ROI is irradiated with only the first charged particle beam, and the diffraction pattern is acquired. If it is determined to check the crystal shift, at 514, the ROI is irradiated with both the first and the second charged particle beams, and the diffraction pattern and the sample image are acquired simultaneously.

At 516, method 500 determines whether the current tilt angle is the last tilt angle for 3D diffraction data acquisition. If the current tilt angle is not the last tilt angle, the sample is tilt to a new tilt angle at 508. Otherwise, method 500 moves to step 522.

At 517, method 500 determines whether the current tilt angle is the last tilt angle for 3D diffraction data acquisition. If the current tilt angle is not the last tilt angle, crystal shift is estimated at 518. Otherwise, method 500 moves to step 522.

At 518, crystal shift in the sample plan is estimated based on sample images taken at different tilt angles, and the amount of the crystal shift is compared with a threshold crystal shift. For example, crystal shift is determined based on the shift from the crystal position in a reference sample image to the crystal position in the current sample image (such as sample image acquired at 514), as well as the tilt angles of the reference sample image and the current sample image. The reference sample image may be the sample image acquired before tilting the sample, such as the sample image acquired at 506. The reference sample image may alternatively be the sample image acquired at a tilt angle different from the tilt angle of the current sample image. A change in the crystal position may be estimated using imaging processing methods such as cross-correlation between the reference sample image and the current sample image. The unit for crystal position change may be the number of pixels in the sample image. The crystal shift may then be calculated based on the crystal position change and the tilt angles of the reference and the current sample images. The crystal shift may be a vector with amplitude corresponding to an amount of the crystal shift and a direction corresponding to a direction of the crystal shift in the sample plane. If the crystal shift amount is greater than a threshold crystal shift, the crystal shift is corrected at 520. Otherwise, the sample is tilted to a new tilt angle at 508.

At 520, the crystal shift is corrected or compensated by adjusting the relative position between the ROI of the sample and the incident first and second charged particle beams so that the ROI of the sample is realigned with the incident first and second charged particle beams. In one example, the sample may be shifted by translating the sample holder in the sample plane based on the crystal shift. In another example, the first and the second charged particle beams may be translated together in the sample plane by adjusting one or more optical components in the optical column based on the crystal shift. The first and the second charged particle beams may be translated together by adjusting standard beam deflectors positioned downstream of the bifocal beamformer. After correcting the crystal shift, the crystal location relative to the incident second charged particle beam is the same as the crystal location when acquiring the reference sample image.

At 522, after collecting diffraction patterns at all tilt angles determined at 504, if the 3D diffraction data is collected for crystallography, the diffraction patterns are optionally selected to generate a diffraction tilt series based on the sample image. For example, one or more diffraction patterns of the collected diffraction patterns may be removed if they are collected at tilt angles that generate strongly non-kinematic or otherwise compromised diffraction patterns. The 3D contour of the crystal under investigation may be reconstructed based on the 2D contour of the crystal in the sample images. The tilt angles corresponding to strongly non-kinematical scattering may be the tilt angles corresponding to the sample thickness along the beam axis of the incident first charged particle beam exceeding a threshold sample thickness. The threshold sample thickness may be 1 micron.

In this way, high quality diffraction tilt series for crystallography analysis may be obtained with reduced data acquisition time. The crystal shift may be tracked and corrected based on the sample image acquired simultaneously with the diffraction pattern. This allows high resolution crystal shift tracking and correction without disturbing the 3D diffraction data acquisition.

Besides crystallography, method 500 may be used for tracking and correcting crystal shift in any application that diffraction patterns are acquired at multiple tilt angles. For example, method 500 may be used for crystal shift tracking and correction during zone axis alignment, wherein the zone axis of crystalline sample is aligned with the incident beam based on diffraction patterns.

FIG. 6 shows an example bifocal image 600 acquired using the bifocal multibeam charged particle system. The bifocal image is collected when the ROI is irradiated with both the first charged particle beam and the second charged particle beam. Bifocal image 600 includes a diffraction pattern (SAED pattern) 601 centered in bifocal image 600 and a sample image 602 at the lower left corner of bifocal image 600. The location of the sample image 602 in bifocal image 600 may be adjusted by adjusting one or more optical components of the optical column, such as the projection lenses of the optical column. The sample image 602 may be moved to a corner of bifocal image 600 to reduce the overlap between the sample image and the diffraction pattern. The sample image 602 includes a crystal 603 within the ROI. The 2D contour of the crystal can be visualized in the sample image 602.

FIG. 7 shows an example timeline for 3D diffraction data acquisition. Plot 701 is the tilt angle of the sample. The tilt angle ranges −A to +A degrees relative to the primary axis. The tilt angle range may be the same as the tilt range of the sample holder. Plot 702 is the status of the axial beam (the first charged particle beam). Plot 703 is the status of the off-axial beam (the second charged particle beam). Plot 704 is the data acquisition status of the controller for acquiring data from detector (such as detector 144 of FIG. 1). Plot 705 is the crystal shift amount in the sample plane. The crystal shift amount increases in the y-axis direction. Plot 706 is the beam shift amount of the incident first and second charged particle beams relative to the ROI. The beam shift amount increases in the y-axis direction. The x-axes are time, and time increases in the direction of the x-axis.

At T1, the first and second charged particle beams are aligned with the ROI. From T1 to T4, the sample is continuously tilted from tilt angle −A to tilt angle +A. While the sample is tilted, the ROI is irradiated with the axial beam. The off-axial beam irradiates the ROI periodically with a time period 731. Image data is acquired with a time period 742, and the duration for acquiring each image data is 741. If the camera is operated in rolling-shutter mode, 741 and 742 are almost similar. The image data is a bifocal image including both the diffraction pattern and the sample image when the ROI is irradiated with both the axial beam and the off-axial beam. The image data is a bifocal image including only the diffraction pattern when the ROI is irradiated with only the axial beam. The time period 742 may depend on the data readout time from the detector to the controller. After acquiring each bifocal image with both the axial and off-axial beams, the crystal shift amount from a reference crystal position in the sample plane is calculated. The reference position may be the crystal position at T1. The crystal shift amount is compared with the crystal shift threshold 751. At T2, responsive to the crystal shift amount higher than the crystal shift threshold, the beam is shifted relative to the ROI by a nonzero beam shift amount. At T3, responsive to the crystal shift amount lower than the crystal shift threshold, the beam is not shifted relative to the ROI.

The technical effect of splitting the charged particles generated by the charged particle source into two charged particle beams is that one of the split beams may be used to correct crystal shift while using the other split beam for acquiring the diffraction patterns of the crystal. The technical effect of directing a first charged particle beam along the primary axis and deflecting a second charged particle beam away from the primary axis by the bifocal beamformer is that the first and the second charged particle beams have overlapped field of view at the sample plane. The technical effect of generating different focal properties of the first charged particle beam and the second charged particle beam is that the first and the second charged particle beams irradiate the ROI with different beam divergencies, so that two types of images (diffraction pattern and sample image) are formed on one detector.

In one embodiment, a method for imaging a sample with charged particle beams includes splitting charged particles generated from a charged particle source into a first charged particle beam and a second charged particle beam; acquiring a diffraction pattern by irradiating a region of interest (ROI) of the sample with the first charged particle beam; and acquiring a sample image by irradiating the ROI with a second charged particle beam. In a first example of the method, the method further includes adjusting a position of the sample relative to the first charged particle beam and the second charged particle beam based on the sample image. A second example of the method optionally includes the first example and further includes tilting the sample about an axis within a sample plane; acquiring another sample image by irradiating the tilted sample with the second charged particle beam; and adjusting the sample position by comparing the sample images acquired before and after tilting the sample. A third example of the method optionally includes one or more of the first and second examples, and further includes wherein adjusting the sample position includes translating the sample relative to the first charged particle beam and the second charged particle beam in a plane perpendicular to an emission axis of the charged particle source. A fourth example of the method optionally includes one or more of the first and third examples, and further includes wherein the first charged particle beam and the second charged particle beam irradiate the ROI at different incident angles. A fifth example of the method optionally includes one or more of the first and fourth examples, and further includes wherein the first charged particle beam is a parallel beam when irradiating the ROI, and the second charged particle beam is a non-parallel beam when irradiating the ROI. A sixth example of the method optionally includes one or more of the first and fifth examples, and further includes, wherein the first charged particle beam and the second charged particle beam have different focal planes near a sample plane. A seventh example of the method optionally includes one or more of the first and sixth examples, and further includes, wherein the diffraction pattern and the sample image are acquired using a detector positioned downstream of the sample. An eighth example of the method optionally includes one or more of the first and seventh examples, and further includes, splitting the charged particles generated by the charged particle source with a bifocal beamformer, and adjusting focal properties of the first charged particle beam and the second charged particle beam differently with the bifocal beamformer. A ninth example of the method optionally includes one or more of the first and eighth examples, and further includes, deflecting the second charged particle beam away from the first charged particle with the bifocal beamformer.

In one embodiment, a method for imaging the sample with charged particle beams includes acquiring a first diffraction pattern and a first sample image by simultaneously irradiating a region of interest (ROI) with a first charged particle beam and a second charged particle beam, wherein the first charged particle beam and the second charged particle beam are formed by splitting charged particles generated by a charged particle source. In a first example of the method, the method further includes adjusting a position of the sample relative to the first charged particle beam and the second charged particle beam based on the first sample image. A second example of the method optionally includes the first example and further includes wherein adjusting the sample position includes shifting the first charged particle beam and the second charged particle beam in a plane orthogonal to an emission axis of the charged particle source. A third example of the method optionally includes one or more of the first and second examples, and further includes continuously tilting the sample about an axis orthogonal to an emission axis of the charged particle source; acquiring a second diffraction pattern and a second sample image of the tilted sample; and adjusting a position of the sample by comparing the second sample image with the first sample image. A fourth example of the method optionally includes one or more of the first and third examples, and further includes continuously tilting the sample about an axis orthogonal to an emission axis of the charged particle source; and acquiring a second diffraction pattern by irradiating the ROI with only the first charged particle beam.

In one embodiment, a system for imaging the sample includes an optical column including a charged particle source and a bifocal beamformer, wherein the bifocal beamformer splits charged particles generated from the charged particle source into a first charged particle beam and a second charged particle beam; a sample positioned in a sample chamber coupled to the optical column; a detector positioned downstream of the sample; and a controller with computer readable instructions stored in a non-transitory memory, the controller is configured to: irradiate a region of interest (ROI) of the sample with the first charged particle beam and acquire a diffraction pattern with the detector; and irradiate the ROI with the second charged particle beam and acquire a sample image with the detector. In a first example of the system, the system further includes, wherein the system further includes a sample holder for tilting the sample about an axis orthogonal to a primary axis of the optical column, and the controller is further configured to tilt the sample with the sample holder and acquire a plurality of diffraction patterns and a plurality of sample images at different tilt angles. A second example of the system optionally includes the first example and further includes, wherein the controller is further configured to determine a crystal shift based on the plurality of sample images; and adjust a sample position relative to the first charged particle beam and the second charged particle beam based on the crystal shift. A third example of the system optionally includes one or more of the first and second examples, and further includes, wherein the controller is further configured to remove one or more diffraction patterns from the plurality of diffraction patterns based on the plurality of sample images to form a diffraction tilt series. A fourth example of the system optionally includes one or more of the first and second examples, and further includes, wherein the controller is further configured to determine a molecular structure of a crystal within the ROI based on the diffraction tilt series.

What is claimed is:

1. A method for imaging a sample with charged particle beams, comprising:
   splitting a charged particle beam generated from a charged particle source into a first charged particle beam and a second charged particle beam;
   acquiring a diffraction pattern by irradiating a region of interest (ROI) of the sample with the first charged particle beam; and
   acquiring a sample image by irradiating the ROI with a second charged particle beam.

2. The method of claim 1, further comprising adjusting a position of the sample relative to the first charged particle beam and the second charged particle beam based on the sample image.

3. The method of claim 2, further comprising tilting the sample about an axis within a sample plane; acquiring another sample image by irradiating the tilted sample with the second charged particle beam; and adjusting the sample position by comparing the sample images acquired before and after tilting the sample.

4. The method of claim 2, wherein adjusting the sample position includes translating the sample relative to the first charged particle beam and the second charged particle beam in a plane perpendicular to an emission axis of the charged particle source.

5. The method of claim 1, wherein the first charged particle beam and the second charged particle beam irradiate the ROI at different incident angles.

6. The method of claim 1, wherein the first charged particle beam is a parallel beam when irradiating the ROI, and the second charged particle beam is a non-parallel beam when irradiating the ROI.

7. The method of claim 1, wherein the first charged particle beam and the second charged particle beam have different focal planes near a sample plane.

8. The method of claim 1, wherein the diffraction pattern and the sample image are acquired using a detector positioned downstream of the sample.

9. The method of claim 1, further comprising splitting the charged particle beam generated by the charged particle source with a bifocal beamformer, and adjusting focal properties of the first charged particle beam and the second charged particle beam differently with the bifocal beamformer.

10. The method of claim 9, further comprising deflecting the second charged particle beam away from the first charged particle beam with the bifocal beamformer.

11. A method for imaging a sample with charged particle beams, comprising:
    acquiring a first diffraction pattern and a first sample image by simultaneously irradiating a region of interest (ROI) with a first charged particle beam and a second charged particle beam, wherein the first diffraction pattern is acquired by irradiating the ROI with the first charge particle beam and the first sample image is acquired by irradiating the ROI with the second charged particle beam, and wherein the first charged particle beam and the second charged particle beam are formed by splitting a charged particle beam generated by a charged particle source.

12. The method of claim 11, further comprising adjusting a position of the sample relative to the first charged particle beam and the second charged particle beam based on the first sample image.

13. The method of claim 12, wherein adjusting the sample position includes shifting the first charged particle beam and the second charged particle beam in a plane orthogonal to an emission axis of the charged particle source.

14. The method of claim 11, further comprising continuously tilting the sample about an axis orthogonal to an emission axis of the charged particle source; acquiring a second diffraction pattern and a second sample image of the tilted sample; and adjusting a position of the sample by comparing the second sample image with the first sample image.

15. The method of claim 11, further comprising continuously tilting the sample about an axis orthogonal to an emission axis of the charged particle source; and acquiring a second diffraction pattern by irradiating the ROI with only the first charged particle beam.

16. A system for imaging a sample, comprising:
an optical column including a charged particle source and a bifocal beamformer, wherein the bifocal beam former splits a charged particle beam generated from the charged particle source into a first charged particle beam and a second charged particle beam;
a sample positioned in a sample chamber coupled to the optical column;
a detector positioned downstream of the sample; and
a controller with computer readable instructions stored in a non-transitory memory, the controller is configured to:
irradiate a region of interest (ROI) of the sample with the first charged particle beam and acquire a diffraction pattern with the detector; and
irradiate the ROI with the second charged particle beam and acquire a sample image with the detector.

17. The system of claim 16, wherein the system further includes a sample holder for tilting the sample about an axis orthogonal to a primary axis of the optical column, and the controller is further configured to tilt the sample with the sample holder and acquire a plurality of diffraction patterns and a plurality of sample images at different tilt angles.

18. The system of claim 17, wherein the controller is further configured to determine a crystal shift based on the plurality of sample images; and adjust a sample position relative to the first charged particle beam and the second charged particle beam based on the crystal shift.

19. The system of claim 17, wherein the controller is further configured to remove one or more diffraction patterns from the plurality of diffraction patterns based on the plurality of sample images to form a diffraction tilt series.

* * * * *